United States Patent [19]

Thacker et al.

[11] 4,276,647
[45] Jun. 30, 1981

[54] HIGH SPEED HAMMING CODE CIRCUIT AND METHOD FOR THE CORRECTION OF ERROR BURSTS

[75] Inventors: Charles P. Thacker, Palo Alto; Fielding M. Norman, Torrance; Ronald E. Rider, Palos Verdes Estates, all of Calif.

[73] Assignee: Xerox Corporation, Stamford, Conn.

[21] Appl. No.: 63,022

[22] Filed: Aug. 2, 1979

[51] Int. Cl.³ ........................................ G06F 11/10
[52] U.S. Cl. ................................. 371/40; 371/38
[58] Field of Search ............................ 371/38, 40, 37

[56] References Cited

U.S. PATENT DOCUMENTS

| | | | |
|---|---|---|---|
| 3,234,364 | 2/1966 | Marko | 371/37 |
| 3,278,729 | 10/1966 | Chien | 371/37 |
| 3,398,300 | 8/1968 | Rupp et al. | 371/37 |
| 3,402,390 | 9/1968 | Tsimbidis et al. | 371/37 |
| 3,404,373 | 10/1968 | Srinivasan | 371/40 |
| 3,585,378 | 5/1971 | Bouicius | 371/38 |
| 3,685,015 | 8/1972 | Bocek | 371/65 |
| 3,697,949 | 10/1972 | Carter et al. | 371/38 |
| 3,725,859 | 4/1973 | Blair et al. | 371/40 |
| 3,745,525 | 7/1973 | Hong et al. | 371/40 |
| 3,745,526 | 7/1973 | Hong et al. | 371/37 |
| 3,745,528 | 7/1973 | Patel | 371/38 |
| 3,775,746 | 11/1973 | Boudreau et al. | 371/37 |
| 3,786,439 | 1/1974 | McDonald et al. | 371/38 |
| 3,800,281 | 3/1974 | Devore et al. | 371/38 |
| 3,851,306 | 11/1974 | Patel | 371/38 |
| 3,859,630 | 1/1975 | Bennett | 371/37 |
| 3,899,580 | 10/1976 | Warman et al. | 371/38 |
| 3,913,068 | 10/1975 | Patel | 371/38 |
| 4,107,650 | 8/1978 | Luke et al. | 371/40 |

OTHER PUBLICATIONS

W. W. Peterson, Error-Correcting Codes, MIT Press, 1972, pp. 427–430, and 442–446.
Lin, An Introduction to Error-Correcting Codes, Prentice-Hall, Inc., 1970, pp. 192–194 and 202.

Primary Examiner—Charles E. Atkinson
Attorney, Agent, or Firm—Robert E. Cunha

[57] ABSTRACT

A circuit and method for the high speed generation and comparison of Hamming codes to enable the correction of an error burst is described. The circuit generates or compares n Hamming codes simultaneously with the data field transmission. Each code word is associated with a data field word comprising every $n^{th}$ bit. The resultant system corrects error bursts of up to n bits.

Additional circuitry is included to enable the correction of error bits in parallel, increasing the system bandwidth.

10 Claims, 7 Drawing Figures

ERROR INFORMATION WORDS AS THEY WOULD APPEAR IN MAIN MEMORY

| WORD NO. | | | | | BIT NUMBER | | | | | | | | | | | COVERS |
|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | WORD NO. |
| FI | 0 | 0 | 0 | 0 | $C_0$ | $C_1$ | $C_2$ | $C_3$ | $C_4$ | $C_5$ | $C_6$ | $C_7$ | $C_8$ | $C_9$ | F2 | 0 |
| FI | 0 | 0 | 0 | 1 | $C_0$ | $C_1$ | $C_2$ | $C_3$ | $C_4$ | $C_5$ | $C_6$ | $C_7$ | $C_8$ | $C_9$ | F2 | 1 |
| FI | 0 | 0 | 1 | 0 | $C_0$ | $C_1$ | $C_2$ | $C_3$ | $C_4$ | $C_5$ | $C_6$ | $C_7$ | $C_8$ | $C_9$ | F2 | 2 |
| FI | 0 | 0 | 1 | 1 | $C_0$ | $C_1$ | $C_2$ | $C_3$ | $C_4$ | $C_5$ | $C_6$ | $C_7$ | $C_8$ | $C_9$ | F2 | 3 |
| FI | 0 | 1 | 0 | 0 | $C_0$ | $C_1$ | $C_2$ | $C_3$ | $C_4$ | $C_5$ | $C_6$ | $C_7$ | $C_8$ | $C_9$ | F2 | 4 |
| FI | 0 | 1 | 0 | 1 | $C_0$ | $C_1$ | $C_2$ | $C_3$ | $C_4$ | $C_5$ | $C_6$ | $C_7$ | $C_8$ | $C_9$ | F2 | 5 |
| FI | 0 | 1 | 1 | 0 | $C_0$ | $C_1$ | $C_2$ | $C_3$ | $C_4$ | $C_5$ | $C_6$ | $C_7$ | $C_8$ | $C_9$ | F2 | 6 |
| FI | 0 | 1 | 1 | 1 | $C_0$ | $C_1$ | $C_2$ | $C_3$ | $C_4$ | $C_5$ | $C_6$ | $C_7$ | $C_8$ | $C_9$ | F2 | 7 |
| FI | 1 | 0 | 0 | 0 | $C_0$ | $C_1$ | $C_2$ | $C_3$ | $C_4$ | $C_5$ | $C_6$ | $C_7$ | $C_8$ | $C_9$ | F2 | 8 |
| FI | 1 | 0 | 0 | 1 | $C_0$ | $C_1$ | $C_2$ | $C_3$ | $C_4$ | $C_5$ | $C_6$ | $C_7$ | $C_8$ | $C_9$ | F2 | 9 |
| FI | 1 | 0 | 1 | 0 | $C_0$ | $C_1$ | $C_2$ | $C_3$ | $C_4$ | $C_5$ | $C_6$ | $C_7$ | $C_8$ | $C_9$ | F2 | 10 |
| FI | 1 | 0 | 1 | 1 | $C_0$ | $C_1$ | $C_2$ | $C_3$ | $C_4$ | $C_5$ | $C_6$ | $C_7$ | $C_8$ | $C_9$ | F2 | 11 |
| FI | 1 | 1 | 0 | 0 | $C_0$ | $C_1$ | $C_2$ | $C_3$ | $C_4$ | $C_5$ | $C_6$ | $C_7$ | $C_8$ | $C_9$ | F2 | 12 |
| FI | 1 | 1 | 0 | 1 | $C_0$ | $C_1$ | $C_2$ | $C_3$ | $C_4$ | $C_5$ | $C_6$ | $C_7$ | $C_8$ | $C_9$ | F2 | 13 |
| FI | 1 | 1 | 1 | 0 | $C_0$ | $C_1$ | $C_2$ | $C_3$ | $C_4$ | $C_5$ | $C_6$ | $C_7$ | $C_8$ | $C_9$ | F2 | 14 |
| FI | 1 | 1 | 1 | 1 | $C_0$ | $C_1$ | $C_2$ | $C_3$ | $C_4$ | $C_5$ | $C_6$ | $C_7$ | $C_8$ | $C_9$ | F2 | 15 |
| FI | BIT ADDRESS | | | | $C_0$ | $C_1$ | $C_2$ | $C_3$ | $C_4$ | $C_5$ | $C_6$ | $C_7$ | $C_8$ | $C_9$ | F2 | BIT ADDRESS |
| ERROR BURST MASK | | | | | | | | | | | | | | | | ERROR BURST MASK |

DATA STREAM / EXAMPLE ERROR BURST bits 0–20, with X at positions 10, 11, 13, 14, 17, 18

FIG. 4

X = ERROR BIT

BIT NO. / DATA WORD NO. 0–15
- Bit 0: X at 10, 13, 14
- Bit 1: X at 2, 3, 10, 11

FIG. 5

CONTENTS OF CP REGISTER, positions 0–15
X at 0, 1, 10, 11, 13, 14

HIGH SPEED HAMMING CODE CIRCUIT AND METHOD FOR THE CORRECTION OF ERROR BURSTS

BACKGROUND OF THE INVENTION

This invention is a circuit for the high speed generation and comparison of Hamming codes for error detection and correction of binary data read onto and subsequently read from a disk or other magnetic media.

During the process of transmitting binary data or transforming binary data from one medium to another, bits may be lost. A typical example would be where data is temporarily on a disk. During the read and write processes the read/record head must be kept at a precise height from the recording medium. A particle of dust or a scratch on the disk surface will interfere with this spacing and result in a loss of information. On magnetic tape it is common for there to be local defective areas of the magnetic surface coating which results in the dropping of data bits.

Various means for detecting errors have been used. One method is to count the number of "one" bits that are loaded onto a magnetic medium in each record or segment, and to store that count modulo some number on the medium immediately after the data field. Subsequently, when the data is read from the magnetic medium, the data bits are again counted. A comparison of the first and second counts will usually detect whether any bits were lost or changed. However, no correction of the data is possible.

Hamming codes have the advantage of being able to detect two errors in a data field, and also to correct a one bit error. When Hamming codes are used in conjunction with other codes (parity checks, check sums, etc.) the detection of any number of error bits, or the corrosion of one error bit per record is obtainable.

There are, however, two disadvantages associated with Hamming codes. The first is that while a one bit error is correctable, errors typically occur in bursts. This is because the physical size of a bit on the disk is small compared to the size of the dust particle, scratch, etc. The result is that errors usually occur in bursts of from several to, perhaps, eleven bits in length. The second disadvantage is that the generation of codes during the write phase, the comparison of codes during the read phase and the correction of data are all complex processes which require significant overhead, reducing the system bandwidth.

What is required by the industry is a coding process that will correct error bursts at high data rates while requiring a minimum amount of computer supervision.

SUMMARY OF THE INVENTION

This invention enables a Hamming code system to correct up to a maximum of n bits for each data field by dividing the total data field into a plurality of $2^m$ bit words where each word is defined as comprising every $n^{th}$ bit. In this case there would be n Hamming codes, each m bits long to provide the capability of correcting up to n bits in a data field with a total of $2^m n$ bits provided that each data word has no more than one error. Also, using this system, all error bits would be correctable if the errors were limited to one burst n bits or less in length.

To use a simplified numerical example, assume a data field of 32 K bits ($2^m n = 32$ K) divided into 16 words and associated Hamming codes (n=16) and a word length of 2 K (m=11). In this system, the first data word would comprise bits 1, 17, 22 . . . , etc. Now, if bits 16 through 24 were in error, the first Hamming code would correct bit 16, the second would correct bit 17, etc. Thus, in each data field, single bursts of up to 16 bits are correctable. Furthermore, as will be described in detail below, a maximum of 16 bits in error are correctable anywhere in the data field as long as no two bits in error occur in the same 2 K bit word.

The above numerical example assumes that all $2^{11}$ bit patterns are usable as Hamming codes. In fact, the code represented; by all zeros is not usable, so the actual maximum data field size = $n(2^m - 1)$ bits. However, the simplified form ($2^m$) will be used in the following discussion to more clearly explain and claim the invention.

Such a complex system of error detection and correction would involve a large overhead penalty if it were accomplished in the software. To allow this system to be used at high data rates a circuit is provided for speeding up the process in both the error detection and error correction modes.

First, the circuit includes m exclusive OR (XOR) gates for generating the codes and m shift registers, one for each XOR gate, each n bits long, to store the results. During the write phase, the circuit generates the codes while the data is being written on the disk. The generated codes are then written at the end of the data field.

During the read phase, a second set of codes are generated in this circuit while the data is being read. Finally, the two sets of codes are compared using the same set of XOR gates to produce the final Hamming code syndrome words. A minimum of computer time is required for these operations since the circuit generates the codes simultaneously with the data transmission.

Second, the circuit includes an additional XOR gate and a parity shift register to speed up the error correction process. This part of the circuit is implemented so that a parity error in any 2 K bit word will be marked by a bit in one of n corresponding parity shift register bit locations. In the numerical example, for instance, if there is a single bit error anywhere in word #2, the parity shift register will contain a bit in position #2. It follows that if the only errors in the entire data field occur in one burst 16 bits or less in length, then a bit mask of these errors will be stored in this parity shift register. Using this mask, the entire set of errors may be corrected in parallel instead of a single bit at a time, as in the ordinary method of Hamming code error correction. This system speeds up the error correction phase considerably, but results in improved performance only if there is a maximum of one error burst of 16 bits or less per data field. In fact, this is usually the case in modern disk drives.

It is thus an object of this invention to provide a circuit for the correction of bursts of errors using Hamming codes. A further object of this invention is to provide a circuit which will process the error detection and error correction phases with a minimum of overhead to allow high system data rates.

BRIEF DESCRIPTION OF THE DRAWINGS

FIG. 2 is a memory map showing the error information format.

FIG. 3 is an example of a typical error burst.

FIG. 4 is an identification of the error bits of FIG. 3 in terms of bit and word numbers.

FIG. 5 is the error burst mask corresponding to the error burst of FIG. 3.

DETAILED DESCRIPTION OF THE INVENTION

Figure 1:
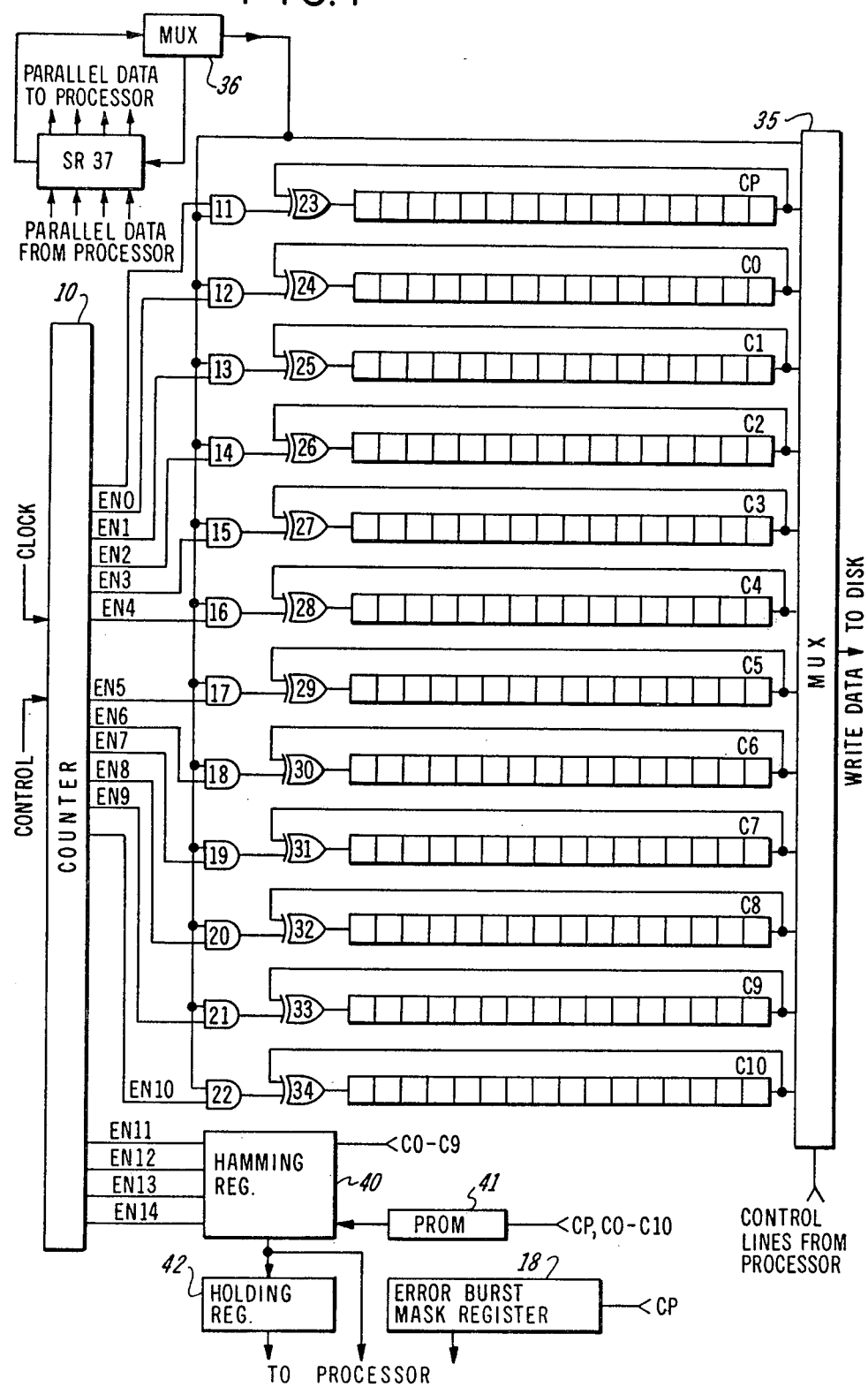
FIG. 1 is a schematic of the circuit.

The circuit operation will be described first in relation to the circuit schematic of FIG. 1.

The first function of this circuit is to transmit a data field from the processor to the disk for storage thereon. Because processors handle data word bits in parallel, and this circuit processes data bits serially, a parallel to series conversion must first be accomplished, typically through the use of a shift register 37 or equivalent. This serial data is then coupled through multiplexers 36 and 35 to the disk.

Simultaneously with this transmission of the data field, gates 11 and 23 and the CP shift register, all of which comprise the "CP Channel", will generate the parity of each $2^m$ bit word in the data field. To use the numerical example referred to previously, in a 32 K bit data field of 16 words, each 2 K bits long, the CP channel will generate 16 parity bits, one for each word, where the first word comprises bits 0, 16, 32 . . . of the data field, the second word comprises bits 1, 17, 33 . . . , etc. This parity generation is accomplished as follows:

After initialization of all circuits at the beginning of the data field transmission, a "generate phase" signal input to gate 37 will turn on gate 11, allowing the first 16 bits to be gated through XOR gate 23 into the CP shift register. The output of the last shift register element is coupled back to the other XOR gate 23 input, but initially all register elements are zero, so the first 16 bits will enter the CP register unchanged.

However, the next set of 16 bits coupled through the XOR gate 23 will be exclusive ORed with the first set, that is bit 0 will be ORed with bit 16, 1 with 17, etc. After the first 32 bits of data are coupled through gate 23, the first shift register bit will contain the parity of bits 0 and 16, the second will contain the parity of 1 and 17, etc. Thus, after the entire 32 K bit data field is coupled through to the disk, the CP channel will also have generated a 16 bit parity word where each bit is the parity of each 2 K bit word.

Simultaneously with the transmission of data to the disk and with the generation of the parity word, the remaining channels C0 through C10 will generate sixteen Hamming codes, each associated with a 2 K bit word. When completed, the eleven shift registers will contain sixteen Hamming codes, each code word comprising a vertical "slice" of the register bits. That is, each code will comprise one associated bit from each of the 11 registers and cover a $2^{11}$ or 2 K bit word.

To generate these code words, first, an 11 bit binary counter is needed to enable the 11 channels in binary counter order. The EN0 through EN10 outputs of counter 20 are connected to gates 12 through 22 and enable channels C0 through C10. This counter 10 is clocked once for each data pulse. Since the output of the least significant channel, EN10, is the fifth least significant counter output line, lines EN0 through EN10 will change every $16^{th}$ data pulse. The result of this configuration, in the numerical example, is that bits 0–15 will be clocked into C10, 16–31 into C9, 32–47 into C10 and C9, etc. in binary order with a change every $16^{th}$ data bit.

As in the CP channel, the shift register outputs are tied back to the XOR gate inputs so that each shift register bit location contains the parity of its associated data field word. For example, the 3rd bit position of any register will contain one bit of code word 3. The final result is that, after 32 K bits have been clocked through the circuit, shift registers C0 through C10 will contain 16 Hamming codes, each 12 bits long, arranged "vertically" in the shift register.

Upon completion of the wiring of the 32 K bit data field onto the disk, the contents of the CP and C0 through C10 shift registers are also written, one complete channel at a time, onto the disk. Finally, an ordinary cylic redundancy check sum or equivalent generated either by software or any commercial device, is written on the disk. This completes the write phase.

When this data is read from the disk, the data will be in serial form and will be converted into word form by shift register 37 or equivalent. At the same time, the serial data is coupled to channels CP and C0 through C10 which generate Hamming codes in a process identical to the process used during the write phase. A check sum is also generated.

Upon completion of the reading of the data field from the disk, and if no errors were made during the entire process, then the codes on the disk will be identical to the codes contained in the registers.

In the compare phase each channel, in turn, is enabled and its data coupled back into the XOR gate at the same time that the associated 16 bit code word is being received from the disk. After 16 clock cycles, if there had been complete agreement, the selected 16 bit shift register would contain all 0's. To the extent that there had been an error, each associated bit would contain a 1. After these 12 compare operations are completed, each vertical slice of shift register bits contains an 11 bit syndrome word which will constitute the relative address of the bit in error, if there had been only one error in that 2 K bit word. The 12th set of bits is used for parity and will be explained below.

At this point, the syndrome words could be used by any software algorithm to find and correct a maximum of 16 error bits in the data field, one per word.

To speed up this error correction process, some hardware has been added to the circuit to automatically provide additional information to the computer. This information is loaded into memory prior to the error correction phase, and is formatted in memory as shown in FIG. 2.

The memory in this disclosed embodiment is 16 bits per word and error information is contained in 18 locations. The first 16 words in this table are similar, and will be discussed together.

Bits 5 through 14 contain the 10 most significant bits of the Hamming code syndrome words. As explained above, at the end of the compare phase these words are in the C0 through C10 channels, with the first bit of each channel coupled to multiplexer 35. These bits are multiplexed out to be used as bits 5 through 14 of the first word of FIG. 1. At the same time, the counter 10 outputs EN11 through EN14 are supplied to memory to identify the syndrome word and are loaded into bits 1 through 4. Also, the F1 and F2 bits are computed as follows by addressing PROM 41 of FIG. 1 with the logical equations $$F1 = [\overline{C10} \cdot CP] + [(C0 + C1 + C2 + C3 + C4 + C5 + C6 + C7 + C8 + C9 + C10) + (CP)]$$

$$F2 = [(C10 \cdot CP] + [(C0 + C1 + C2 + C3 + C4 + C5 + C6 + C7 + C8 + C9 + C10) + (CP)]$$

and loaded into bits 0 and 15 of memory. Finally, the counter 10 is incremented and the channel register data is shifted one bit to the right to prepare for the next cycle. In this way, the first 16 locations of memory as shown in FIG. 2 are loaded.

The first step in this error correction process is to compare the check sums generated during the read and write phases. If they agree, there were no errors.

If the check sums do not agree, then each line of the table in FIG. 2 is processed as follows. First the F1 and F2 bits are tested. If both are 0, there is no error on this line (no error in the first word) and the program advances to the next line. If F1 and F2 are both 1, an inspection of the logic equations above will show that there must exist a parity bit error and no C0 through C10 error bits, which indicates an error in the Hamming code itself; or an even number of errors which are not correctable. If F1 equals 0 and F2 equals 1, there is a correctable error in an odd word and if F1 equals 1 and F2 equals 0, there is a correctable error in an even word.

If the presence of a correctable error is determined, bits 1 through 15 are used to generate the bit address, and that bit is then complemented to correct it. The process then proceeds to the next line of FIG. 2.

A further improvement in speed is possible if, instead of correcting bits individually as in the method described above, a plurality of error bits could be corrected simultaneously. The method to be next described will accomplish this function provided that all errors are contained within a 16 bit error burst anywhere in the data field. In fact, this usually is the case.

For each line, the F1 and F2 bits are inspected for the presence of a correctable error. When one is found all of the information on the associated line of the Table in FIG. 2 is loaded into the holding register 42 of FIG. 2. To use the numerical example of FIG. 3, let the bits in error be the 10$^{th}$, 11$^{th}$, 13$^{th}$, 14$^{th}$, 17$^{th}$ and 18$^{th}$ bits of the data field. This error burst is 9 bits long where a burst is defined as the number of bits between and including the first and last error bits. Also, no two error bits are in the same word. Here the errors are in words 10, 11, 13, 14, 1 and 2 respectively. Therefore all errors are correctable. The first line, the code for word number 0, in FIG. 2 is inspected and no errors are present. Next, the line for word number 1 is inspected. The F1 and F2 bits will indicate a correctable error and the infomation equivalent to line 1 of the Table of FIG. 2 will be loaded into the holding register 42 of FIG. 1. Bits 1 through 4 will point to data word number 1 and bits 5 through 14, in conjunction with the F1 and F2 bits will specify the bit number within the specified word, in this case, bit number 1.

The process then proceeds to the next line of the Table of FIG. 2. Again an error is detected, this time bit number 18 of the FIG. 3 data bit stream which is bit number 1 of word number 2 in FIG. 4. The second time, and at all times thereafter, that an error is detected, the least significant bit of the bit number of the instant error and the previous error are compared. If they are equal, as in this numerical example they are both bit number 1, then the holding register 42 is reloaded with the associated FIG. 2 line information. In the numerical example, the previous holding register 42 contents will be replaced with a line of data pointing to data word number 2, bit number 1.

The process then proceeds through the table until it finds the next correctable error, which is bit number 0, word number 13 in the example of FIG. 4. In this instance, the bit number least significant bit is different so the holding register 42 contents are not updated, but are loaded into the next to last position in the table. The remainder of the first 16 lines are ignored. The last position of the table is loaded with the contents of the CP register of FIG. 1.

The errors may now be corrected in parallel as follows. First the CP register bit pattern is split into two masks, one covering the bit addressed in the "bit address" line of FIG. 2 and all bits to the left of it, the other covering the remaining bits of the mask. A line is drawn in FIG. 5 to show this division. Now, the two masks can be used to complement the error bits in the data field by exclusive ORing the bit mask with the addressed portion of the data field.

The specific circuitry is used in these processes is shown in FIG. 1. The data as shown in FIG. 2 is first assembled in the Hamming register 40 of FIG. 1. The C0 through C9 data is coupled in directly from the associated shift register, the word number is received from the counter 10, and the F1 and F2 bits are produced by the PROM 41 which uses the CP and C0 through C10 signals as address inputs. After assembly, the data is tested for a correctable error and for a change in the least significant bit of the bit number as described above in relation to the parallel method of error correction. Depending on these tests, the data may be loaded into the holding register 42 in addition to being sent to the process table of FIG. 2.

As the C0 through C10 data is being read out, one bit at a time, the CP data is loaded into the error burst mask register 43. Therefore, after the 16 regular syndrome words are loaded into the table, the holding register 42 and error burst mask register 43 contain their appropriate FIG. 2 table information and the contents of these registers are loaded into the last two locations, completing the table.

Figure 6:
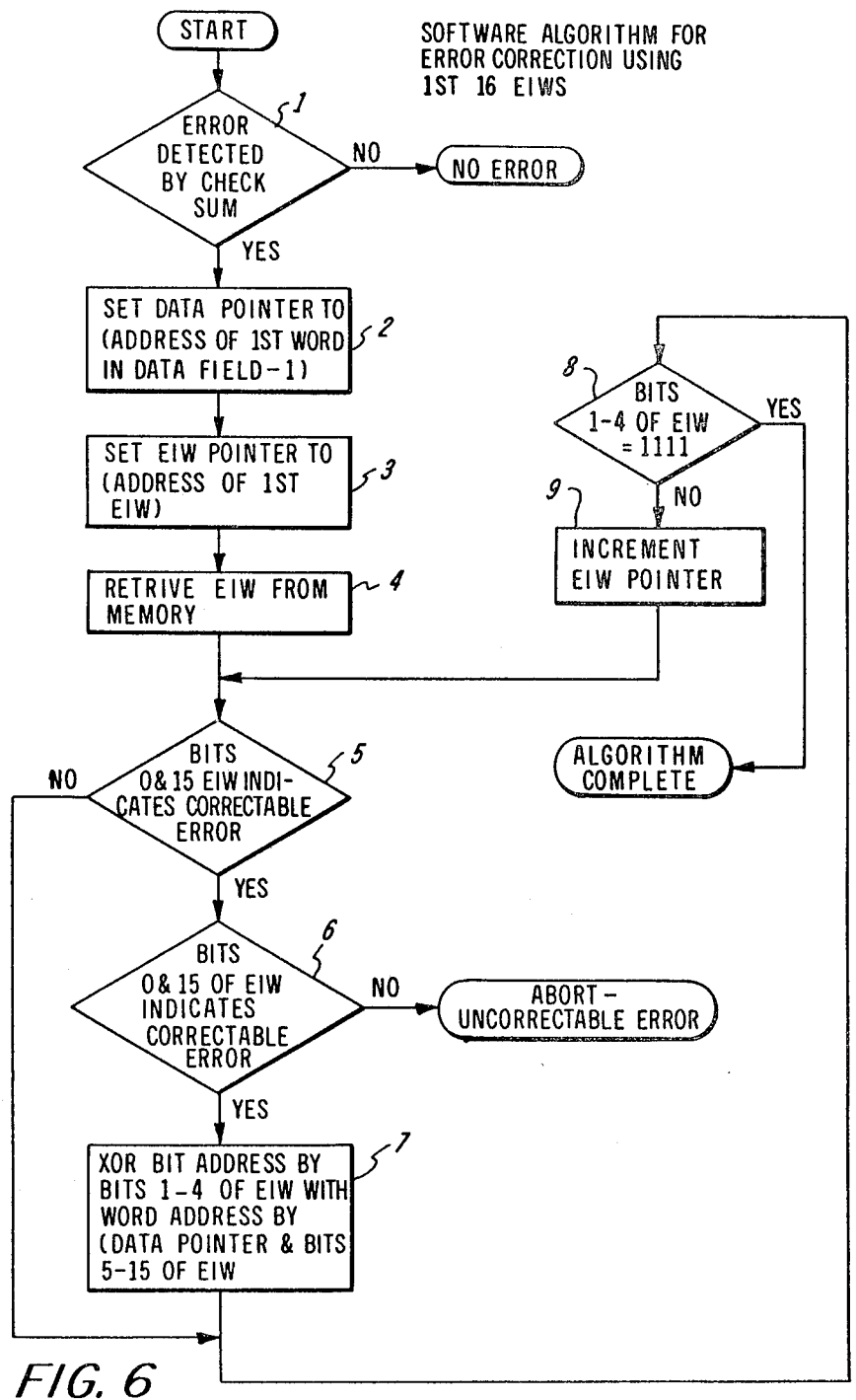
FIG. 6 is a flow chart of the error correction process using the first sixteen error information words.
Figure 7:
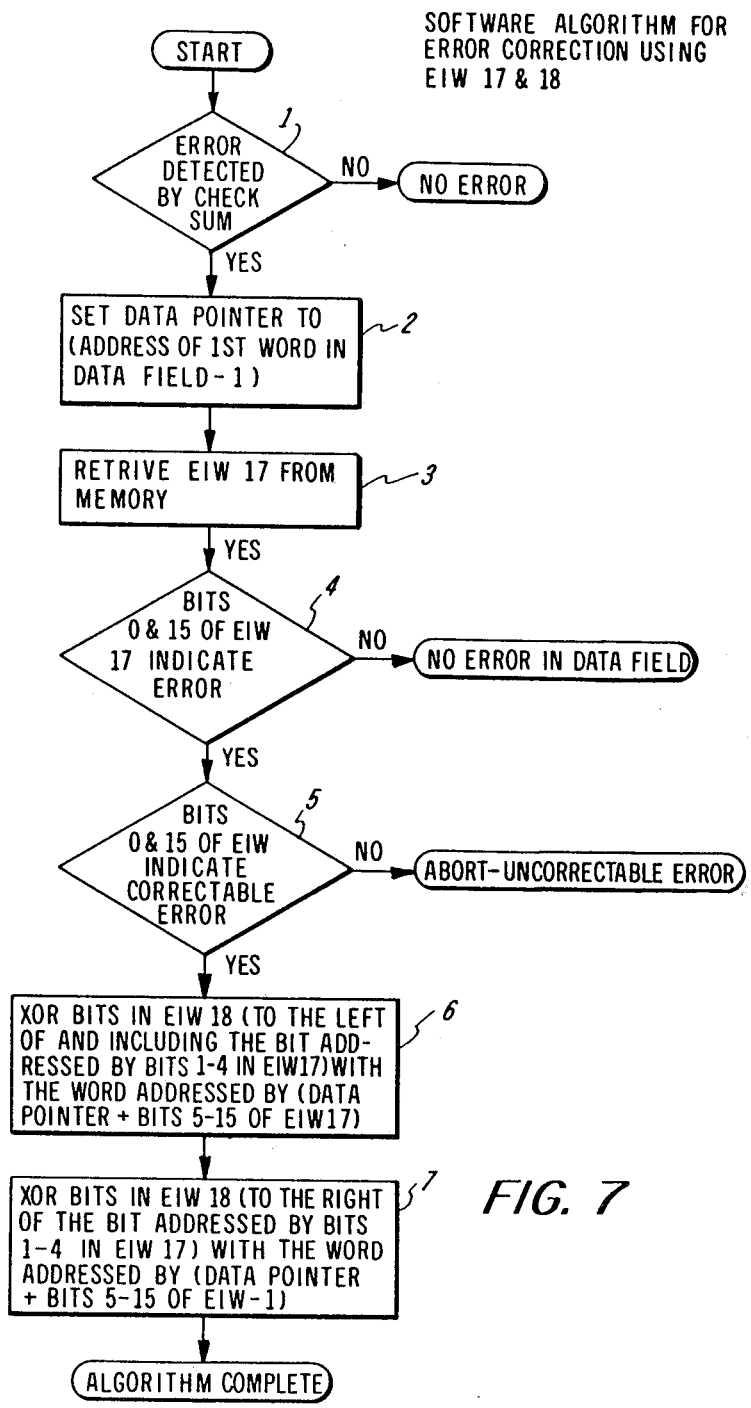
FIG. 7 is a flow chart of the error correction process using the last two error information words.

Flow charts of the software required to implement the two above-described error correction systems are included as FIGS. 6 and 7. FIG. 6 is the algorithm for error correction using the first 16 lines of the table of FIG. 2, FIG. 7 is the higher speed algorithm using the last two lines.

As shown in FIG. 6, step 1 of the program uses the check sum to detect the presence of any errors. If the check sum shows no errors, the program terminates. If a check sum error has been detected, steps 2 and 3 set pointers to the first words of the data field and the error word table. Then the first error word is read from memory in step 4.

Decisions 5 and 6 determine if the error is correctable. If it is, the bit address is computed and the bit corrected in step 7. Step 8 tests whether all 16 lines have been processed. If not, the program increments the error word pointer and repeats the loop starting at step 5. After the 16 error words are processed, the program terminates.

FIG. 7 is the high speed program flow chart which uses the bit address word and the error burst mask. If a check sum error is detected in step 1, a pointer is set to the first word of the data field in step 2, and the bit address is retrieved in step 3. As before, steps 4 and 5 test for a correctable bit in the bit address word.

If the errors are correctable, the bits in the error mask to the left of and including the bit addressed by the bit address word are exclusive ORed with the associated 16 bits of the data field in step 6.

Finally, in step 7 the data field pointer is decremented and the error mask bits to the right of the bit addressed by the bit address are exclusive ORed with the 16 data field bits immediately prior to those corrected in step 6.

This invention has been discussed in conjunction with data storage on magnetic disk, but can be used for the correction of errors during any kind of binary information transfer. For one-way transmission, a circuit would be required at both the receiving and transmitting stations. This circuit is also usable during the temporary storage of data in any medium such as magnetic tape, bubble memory, delay lines, and CCD's.

The storage elements in the described embodiment are a set of shift registers. However, any memory element could have been used which is capable of supplying to each OR gate the appropriate $n^{th}$ bit to enable Hamming code generation. A RAM memory, for instance, could have been used.

The invention has been described with reference to the presently preferred and illustrated embodiment. It is not intended that the invention be unduly limited by this disclosure. Instead, the invention is intended to be defined by the means and their obvious equivalents set forth in the following claims.

What is claimed is:

1. A circuit, comprising an input and an output, for transmitting a data field comprising a serial bit stream and for simultaneously generating Hamming codes to be used for correcting an n bit error burst in said data field comprising:

m storage means, each for serially storing n bits of binary data, an exclusive OR gate for each storage means, the output of each exclusive OR gate coupled to the storage means input, the output of each storage means coupled to one input of its associated exclusive OR gate, and the other input of said exclusive OR gate coupled to said circuit input, an m bit counter for enabling said exclusive OR gates in binary count order, said counter incrementing every $n^{th}$ data bit time, to generate and store in said storage means n Hamming codes, each m bits long, during the data field transmission time, and a multiplexer for coupling said data field from said circuit input to said circuit output, and thereafter, for coupling said Hamming codes from said storage means output to said circuit output.

2. The circuit of claim 1 wherein said storage means are shift registers.

3. The circuit of claim 2 further comprising:
   a parity shift register n bits long,
   a parity exclusive OR gate, the output of which is coupled to the serial input of said parity shift register, the serial output of said parity shift register coupled to one input of said parity OR gate, and the other input of said parity OR gate coupled to said circuit input, and
   wherein said multiplexer also couples the parity shift register contents to said circuit output.

4. A circuit which can be used either for generating n Hamming codes each m bits long during the transmission of data or for the comparison of Hamming codes to create Hamming code syndrome words comprising:
   means for receiving serial binary data or Hamming codes,
   m shift registers, each n bits long,
   an exclusive OR gate for each shift register, the output of each exclusive OR gate coupled to the serial input of each shift register, the serial output of each shift register coupled to one input of its associated exclusive OR gate, and the other input of said exclusive OR gate coupled to said means for receiving,
   a multiplexer for outputting said binary data received by said means for receiving or for outputting the contents of said shift registers, and
   control means for enabling said exclusive OR gates in binary count order to generate Hamming codes in said shift registers, or to enable said exclusive OR gates sequentially, as an input set of Hamming codes is being received, to compare the codes being received to the codes stored in shift registers to generate Hamming code syndrome words at the output of said OR gates for temporary storage in said shift registers.

5. The circuit of claim 4 further including:
   a parity shift register n bits long,
   a parity exclusive OR gate, the output coupled to the serial input of said parity shift register, the serial output of said parity shift register coupled to one input of said parity exclusive OR gate, and the other input of said parity exclusive OR gate coupled to said circuit input, and
   wherein said multiplexer couples the parity shift register contents to said output.

6. The circuit of claim 5 further comprising:
   means coupled to said multiplexer for storing a syndrome word which specifies the location in said data of an error burst, and
   means coupled to said parity register for storing the contents of said parity register, said contents comprising a bit map of the bits in error.

7. The method of using Hamming codes to correct an n bit error burst in a serial data field a maximum of $2^m$ n bits long comprising the steps of
   generating two sets of n Hamming codes, one during the transmission and one during the reception of said data, each code word m bits long and each code word associated with a $2^m$ bit word where every $n^{th}$ bit in the data field comprises a data word,
   generating two n bit parity words, one during the transmission and one during the reception of said data, where each parity bit is the parity of each word,
   comparing said two sets of Hamming codes to determine syndrome words to determine the location of said error burst in said data stream,
   comparing the parity words to generate an error burst bit map, and
   correcting the errors in parallel by exclusive ORing the bit map with the data in the locations specified by said syndrome words.

8. The method of generating Hamming codes for correcting an n bit error burst in a data stream $2^m$ n bits long comprising the steps of:
   initializing m words of memory, each n bits long,
   exclusive ORing the contents of the first n bits of data with the contents of the first word of memory, continuing to exclusive OR the incoming n bit data words with the contents of the memory word locations in binary count order, so that, after the entire data stream has been transmitted, said m words of memory will contain n Hamming code words, each m bits long, one bit of each Hamming code word in each memory word location.

9. The method of generating a first set of Hamming codes during a first transmission of data and the subsequent comparing of a second set of Hamming codes generated during a second transmission of said data to said first set, comprising the steps of:

using the steps of claim 8 to generate a first set of Hamming codes during the first transmission of data, temporarily storing said first set of Hamming codes, using the steps of claim 8 to generate a second set of Hamming codes during the second transmission of data, and exclusive ORing the first and second sets of Hamming codes to produce syndrome words.

10. The method of correcting an n bit error burst in a transmitted and received data stream containing n words, each $2^m$ bits long where each word comprises every $n^{th}$ bit of said data stream, comprising the steps of:

determining the parity of each $2^m$ bit word of transmitted data, using the method of claim 8 to generate a first set of Hamming code words from said transmitted data, determining the parity of each $2^m$ bit word of received data, using the method of claim 8 to generate a second set of Hamming code words from said received data, exclusive ORing the first and second sets of Hamming codes thus produced to produce syndrome words to indicate the location in the data stream of said error burst, exclusive ORing the parity of each $2^m$ bit word of transmitted and received data to produce a bit mark of the error burst, and using the bit mask and error location thus determined to correct the error bits in parallel.

* * * * *